(12) United States Patent
Tohata et al.

(10) Patent No.: US 7,535,784 B2
(45) Date of Patent: May 19, 2009

(54) SEMICONDUCTOR MEMORY DEVICE HAVING REPLICA CIRCUIT

(75) Inventors: Akihito Tohata, Yokohama (JP); Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 11/872,292

(22) Filed: Oct. 15, 2007

(65) Prior Publication Data
US 2008/0089156 A1  Apr. 17, 2008

(30) Foreign Application Priority Data
Oct. 16, 2006  (JP)  ............................. 2006-281744

(51) Int. Cl.
*G11C 7/14* (2006.01)
(52) U.S. Cl. ................ 365/210.1; 365/196; 365/230.03
(58) Field of Classification Search .................. 365/196
See application file for complete search history.

(56) References Cited
U.S. PATENT DOCUMENTS 6,434,074 B1 *  8/2002  Brown ................... 365/189.15

6,490,214 B2  12/2002  Kawasumi
6,804,153 B2  10/2004  Yoshizawa et al.
6,839,295 B1 *  1/2005  Jeung .................... 365/189.15
6,982,914 B2  1/2006  Ohtsuki et al.

FOREIGN PATENT DOCUMENTS

JP  2002-056682  2/2002

* cited by examiner

*Primary Examiner*—Tan T. Nguyen
(74) *Attorney, Agent, or Firm*—Amin, Turocy & Calvin, LLP

(57) ABSTRACT

A semiconductor memory device includes first and second cell arrays which have memory cells arrayed in row and column directions, first and second bit lines which are connected to the memory cells arrayed in the column direction, and first and second sense amplifiers which are connected to the first, second bit lines, respectively. The device also includes first and second dummy cell arrays which have dummy cells arrayed in the row and column directions, a dummy word line which is connected to the dummy cells arrayed in the row direction, first and second dummy bit lines which are connected to the dummy cells arrayed in the column direction and receive an output from the dummy word line, and first and second sense amplifier activation circuits which activate the first, second sense amplifiers in accordance with first and second control signals output from the first and second dummy bit lines, respectively.

11 Claims, 2 Drawing Sheets

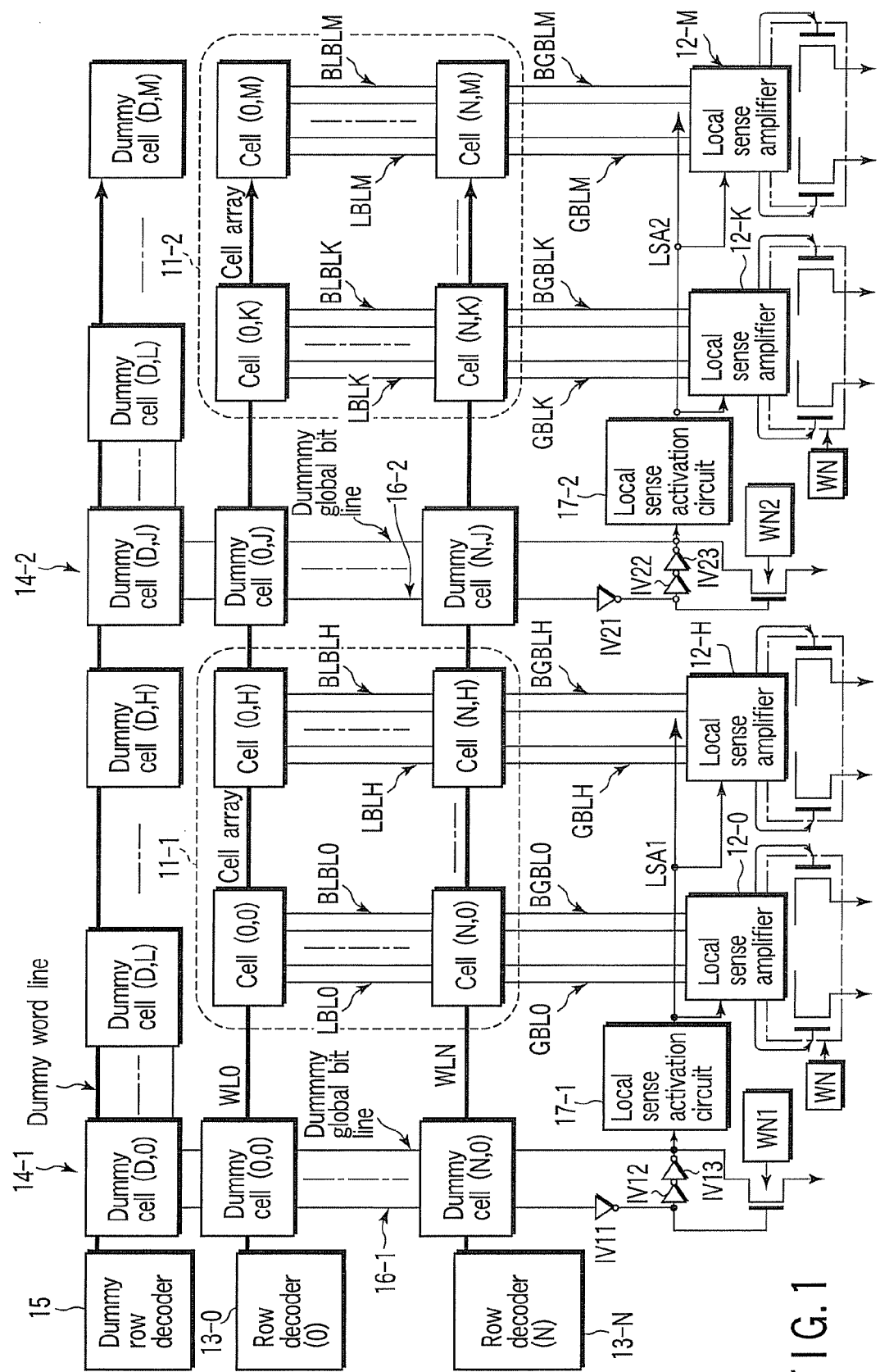
F I G. 1

SEMICONDUCTOR MEMORY DEVICE HAVING REPLICA CIRCUIT

CROSS-REFERENCE TO RELATED APPLICATIONS

This application is based upon and claims the benefit of priority from prior Japanese Patent Application No. 2006-281744, filed Oct. 16, 2006, the entire contents of which are incorporated herein by reference.

BACKGROUND OF THE INVENTION

1. Field of the Invention

The present invention relates to a semiconductor memory device having a replica circuit for controlling the sense timing of a sense amplifier.

2. Description of the Related Art

Along with an increase in the degree of integration of a large-scale integrated circuit (LSI), the occupation ratio of a static random access memory (SRAM) macro mounted on a system-on-chip (SoC) with respect to the chip area is increasingly becoming higher, and demand for a bulk SRAM megabit-order generator has arisen. In the bulk SRAM macro, it is difficult to generate a sense amplifier activation timing to ensure an optimum sense margin for each of the SRAM macros which are generated by a generator and have different capacities and configurations.

An example of a conventional semiconductor memory device having a replica circuit will be described.

In the replica circuit, a dummy word line connected to a dummy row decoder runs through dummy cells arrayed in the row direction and turns back. The dummy word line is then connected to dummy cells arrayed in the column direction through a dummy bit line and further connected to a local sense activation circuit through, e.g., an inverter. The turnback is done in a distance half an actual word line (e.g., Jpn. Pat. Appln. KOKAI Publication No. 2002-56682).

The dummy word line reflects the actual word line length up to the farthest point. Hence, the dummy bit line reproduces the farthest bit line. The replica circuit determines the sense start timing, and generates a sense start signal (sense activation signal) and notifies the sense amplifier of the cell array of the start of sensing.

As described above, the conventional SRAM generator traces the word line WL delay and bit line BL delay corresponding to the number of rows/columns of the cell array, thereby generating a sense timing corresponding to different row/column configurations. Conventionally, since the word lines are made of polysilicon and the necessary memory capacity is small, the wiring delay up to the sense amplifier is so small as to be insignificant as compared to the dummy word line delay or dummy bit line delay. However, with the advance of process, the required memory capacity increases, and the material of word lines changes from polysilicon to a metal. Thus, although the dummy word line delay decreases, the wiring delay up to the sense amplifier becomes equal to or more than the word line delay and cannot be neglected any more. Additionally, the larger the memory capacity becomes, the larger the difference between the word line delay and the wiring delay up to the sense amplifier becomes. It is therefore difficult to ensure an optimum sense margin for each of the SRAMs having different memory capacities and configurations. That is, it is difficult to form a generator.

BRIEF SUMMARY OF THE INVENTION

According to an aspect of the present invention, there is provided a semiconductor memory device comprising: a first cell array which has a plurality of memory cells arrayed in row and column directions; a word line which is connected to the plurality of memory cells arrayed in the row direction; a first bit line which is connected to the plurality of memory cells arrayed in the column direction in the first cell array; a first sense amplifier which is connected to the first bit line; a first dummy cell array which has a plurality of dummy cells arrayed in row and column directions; a dummy word line which is connected to the plurality of dummy cells arrayed in the row direction; a first dummy bit line which is connected to the plurality of dummy cells arrayed in the column direction in the first dummy cell array and receives an output from the dummy word line; a first sense amplifier activation circuit which activates the first sense amplifier in accordance with a first control signal output from the first dummy bit line; a second cell array which has a plurality of memory cells arrayed in the row and column directions, the plurality of memory cells arrayed in the row directions being connected to the word line; a second bit line which is connected to the plurality of memory cells arrayed in the column direction in the second cell array; a second sense amplifier which is connected to the second bit line; a second dummy cell array which has a plurality of dummy cells arrayed in row and column directions, the plurality of dummy cells arrayed in the row directions being connected to the dummy word line, the plurality of dummy cells arrayed in the column directions being located between the first cell array and the second cell array, and the plurality of dummy cells arrayed in the column directions being connected to the word line; a second dummy bit line which is connected to the plurality of dummy cells arrayed in the column direction in the second dummy cell array and receives the output from the dummy word line; and a second sense amplifier activation circuit which activates the second sense amplifier in accordance with a second control signal output from the second dummy bit line.

BRIEF DESCRIPTION OF THE SEVERAL VIEWS OF THE DRAWING

FIG. 1 is a block diagram showing the arrangement of a semiconductor memory device according to a first embodiment of the present invention.

DETAILED DESCRIPTION OF THE INVENTION

Figure 2:
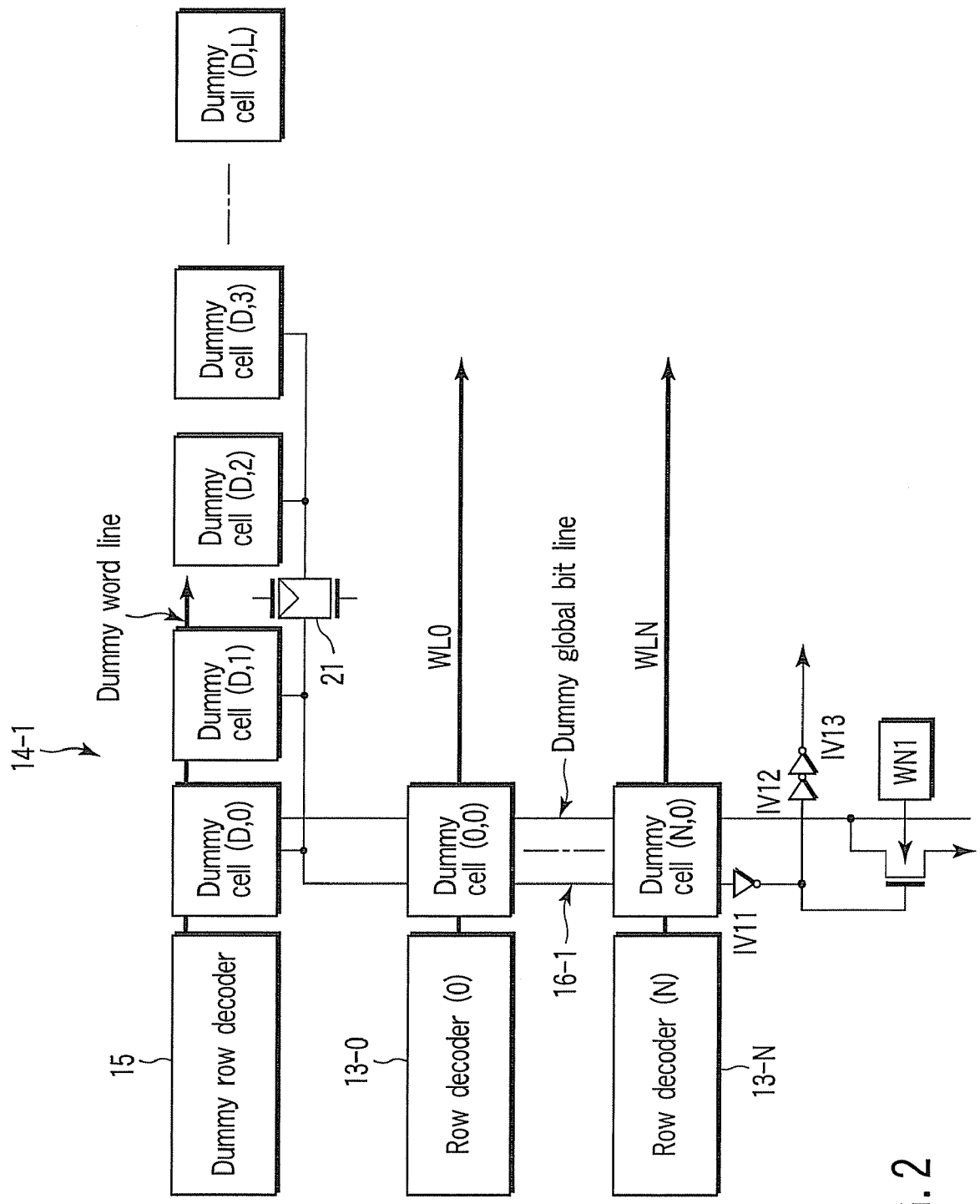
FIG. 2 is a block diagram showing the arrangement of a semiconductor memory device according to a second embodiment of the present invention.

The embodiments of the present invention will be described below with reference to the accompanying drawing. The same reference numbers denote the same parts throughout the drawing.

First Embodiment

FIG. 1 is a block diagram showing the arrangement of a semiconductor memory device according to an embodiment of the present invention. As shown in FIG. 1, a cell array having (N+1) rows and (M+1) columns includes cells (0,0) to (N,M). The cell array with N rows and M columns includes a cell array 11-1 having cells (0,0) to (N,H) and a cell array 11-2 having cells (0,K) to (N,M).

(N+1) cells indicated by cells (0,0) to (N,0) are connected to a pair of bit lines LBL0 and BLBL0 in cell array 11-1. A local sense amplifier 12-0 is connected to one end of the pair of bit lines. Similarly, (N+1) cells are connected to the pair of bit lines of each of the subsequent columns. A local sense amplifier is connected to one end of each pair of bit lines. (N+1) cells indicated by cells (0,H) to (N,H) are connected to a pair of bit lines LBLH and BLBLH of the final column in cell array 11-1. A local sense amplifier 12-H is connected to one end of bit-line pair LBLH and BLBLH.

(N+1) cells indicated by cells (0,K) to (N,K) are connected to a pair of bit lines LBLK and BLBLK in cell array 11-2. A local sense amplifier 12-K is connected to one end of the pair of bit lines. Similarly, (N+1) cells are connected to the pair of bit lines of each of the subsequent columns. A local sense amplifier is connected to one end of each pair of bit lines. (N+1) cells indicated by cells (0,M) to (N,M) are connected to a pair of bit lines LBLM and BLBLM of the final column in cell array 11-2. A local sense amplifier 12-M is connected to one end of bit-line pair LBLM and BLBLM.

Each of local sense amplifiers 12-0 to 12-M senses a selected memory cell connected to a pair of bit lines and reads out data stored in the memory cell.

Word lines WL0 to WLN are connected to cells arrayed in the row direction. Row decoders 13-0 to 13-N for driving the word lines WL0 to WLN are connected to the word lines WL0 to WLN, respectively. A replica circuit 14-1 for adjusting the sense timing of cell array 11-1 is arranged between the row decoders 13-0 to 13-N and cell array 11-1. Additionally, a replica circuit 14-2 for adjusting the sense timing of cell array 11-2 is arranged between cell array 11-1 and cell array 11-2.

Replica circuit 14-1 of cell array 11-1 includes a dummy array indicated by dummy cells (D,0) to (D,L) and dummy cells (0,0) to (N,0), a dummy word line connected to dummy cells (D,0) to (D,L), a dummy row decoder 15 connected to the dummy word line, and a dummy local bit line 16-1 and dummy global bit line which are connected to dummy cells (0,0) to (N,0).

Replica circuit 14-2 of cell array 11-2 includes a dummy array indicated by dummy cells (D,J) to (D,L) and dummy cells (0,J) to (N,J), a dummy word line connected to dummy cells (D,J) to (D,L), and a dummy local bit line 16-2 and dummy global bit line which are connected to dummy cells (0,J) to (N,J). Dummy cells (D,0) to (D,M) are connected to the same dummy word line and driven by the same driver.

The number of dummy cells (0,0) to (N,0) connected to a dummy bit line and the number of dummy cells (0,J) to (N,J) connected to a dummy bit line are (N+1), i.e., equal to the number of cells connected to a pair of bit lines. In the layout, dummy cells (0,0) to (N,0) and cells (0,0) to (N,0), or dummy cells (0,J) to (N,J) and cells (0,K) to (N,K) are arranged in parallel. Hence, the word lines WL0 to WLN run through these cells. However, the word lines WL0 to WLN are not connected to dummy cells (0,0) to (N,0) and dummy cells (0,J) to (N,J).

The dummy row decoder 15 is connected to the dummy word line connected to dummy cells (D,0) to (D,M). Dummy local bit line 16-1 is connected to dummy cell (D,0). Dummy local bit line 16-1 runs through dummy cells (0,0) to (N,0) and then through inverters IV11, IV12, and IV13, and is connected to a local sense activation circuit 17-1 which activates local sense amplifiers 12-0 to 12-H. Local sense activation circuit 17-1 is connected to local sense amplifiers 12-0 to 12-H. Dummy local bit line 16-1 is also connected to the gate of a transistor WN1 through inverter IV11. A transistor WN is connected to local sense amplifiers 12-0 to 12-H.

Dummy local bit line 16-2 is connected to dummy cell (D,J). Dummy local bit line 16-2 runs through dummy cells (0,J) to (N,J) and then through inverters IV21, IV22, and IV23, and is connected to a local sense activation circuit 17-2 which activates local sense amplifiers 12-K to 12-M. Local sense activation circuit 17-2 is connected to local sense amplifiers 12-K to 12-M. Dummy local bit line 16-2 is also connected to the gate of a transistor WN2 through inverter IV21. A transistor WN is connected to local sense amplifiers 12-K to 12-M.

The output signal from the dummy row decoder 15 is transmitted through dummy cells (D,0) to (D,L) by the dummy word line and returned to dummy cell (D,0). The output signal returned to dummy cell (D,0) is transmitted through dummy cells (0,0) to (N,0) by dummy local bit line 16-1, and input to local sense activation circuit 17-1 through inverters IV11, IV12, and IV13. Local sense activation circuit 17-1 outputs a sense start signal (sense activation signal) LSA1 to local sense amplifiers 12-0 to 12-H in accordance with the received output signal. Sense start signal LSA1 starts sensing by local sense amplifiers 12-0 to 12-H. In other words, sense start signal LSA1 activates local sense amplifiers 12-0 to 12-H.

The output signal from the dummy row decoder 15 is transmitted through dummy cell (D,0) to dummy cell (D,L) in the replica circuit 14-2 by the dummy word line and returned to dummy cell (D,J). The output signal returned to dummy cell (D,J) is transmitted through dummy cells (0,J) to (N,J) by dummy local bit line 16-2, and input to local sense activation circuit 17-2 through inverters IV21, IV22, and IV23. Local sense activation circuit 17-2 outputs a sense start signal (sense activation signal) LSA2 to local sense amplifiers 12-K to 12-M in accordance with the received output signal. Sense start signal LSA2 starts sensing by local sense amplifiers 12-K to 12-M. In other words, sense start signal LSA2 activates local sense amplifiers 12-K to 12-M.

The dummy local bit line adjusts the activation timings of local sense amplifiers 12-0 to 12-M such that they execute sense when a sufficient potential difference (e.g., 100 mV) is generated between the pair of bit lines (LBL0 and BLBL0) closest (referred to as the closest pair of bit lines hereinafter) to the row decoders 13-0 to 13-N and the pair of bit lines (LBLM and BLBLM) farthest (referred to as the farthest pair of bit lines hereinafter) from the row decoders 13-0 to 13-N. In this embodiment, a dummy bit line to determine the sense timings of local sense amplifiers 12-0 to 12-M is arranged for each of divided cell arrays 11-1 and 11-2 to individually generate a sense start signal. In the prior art, it is necessary to ensure, as a margin, the potential difference between the closest pair of bit lines (LBL0 and BLBL0) and the farthest pair of bit lines (LBLM and BLBLM) of the memory cells. In this embodiment, however, it is only necessary to ensure the potential difference between the closest pair of bit lines (LBL0 and BLBL0) and the farthest pair of bit lines (LBLH and BLBLH) in divided cell array 11-1, and ensure the potential difference between the closest pair of bit lines (LBLK and BLBLK) and the farthest pair of bit lines (LBLM and BLBLM) in cell array 11-2.

In this embodiment, the area increases because of addition of the dummy bit lines. Two columns are necessary for adding one dummy bit line. Examine an increase in area for a cell array having, e.g., 512 rows and 512 columns. The area in this embodiment wherein the columns are divided into two groups is compared with that in the conventional arrangement. The increase in area is represented by 512*516/512*514=0.4%. That is, the increase is very small.

As described above, since the required memory capacity increases, if SRAM macros have different capacities and configurations, the sense amplifier timing necessary for the number of columns changes. It is therefore difficult to form a generator. In this embodiment, however, dummy cells and dummy bit lines are locally provided to optimize the sense timing in an appropriate cell array and added for each cell array. In this case, even when the number of columns varies, the sense timing need not be adjusted individually. This facilitates timing.

Furthermore, sense errors caused by a variation in threshold voltage Vth of a cell can be reduced. Assume that the threshold voltage Vth is low in the cell closest to the row decoder and then rises as the distance from the row decoder increases. In the conventional arrangement, the dummy bit line swings immediately and transmits the sense start signal quickly. However, the farthest cell has a relatively high threshold voltage Vth, and the potential difference of 100 mV is obtained in the bit line at a late timing.

Since sensing starts before a sufficient sense margin is obtained in the farthest sense amplifier, a sense error may take place. In contrast, in this embodiment dummy cells and dummy bit lines are arranged in each cell array. A sense start signal corresponding to the variation in threshold voltage Vth can be generated for each cell array. It is therefore possible to reduce sense errors caused by the variation in threshold voltage Vth.

According to the first embodiment of the present invention, it is possible to provide a manufacturing SRAM memory cell array layout with the regular repetitiveness of the pattern of the SRAM memory cell array. As shown in FIG. 1, that is, dummy cells (0,J) to (N,J) in the replica circuit 14-2 is located at the boundary between cell array 11-1 and cell array 11-2, and the pattern of dummy of cells (0,J) to (N,J) in the replica circuit 14-2 is with the same repetitiveness of the pattern of cell array 11-1 and cell array 11-2. Consequently, cell array 11-1 and cell array 11-2 are located adjacent through dummy of cells (0,J) to (N,J) with the regular repetitiveness of the pattern. This layout is effective in SRAM, because it is inevitable to increase memory volume that a manufacturing SRAM memory cell array layout is with the regular repetitiveness of the pattern of the SRAM memory cell array.

According to the first embodiment of the present invention, it is possible to provide a semiconductor memory device capable of setting, for each cell array, the activation timings of sense amplifiers included in the cell array. It is also possible to increase the memory capacity without changing the activation timings of the sense amplifiers.

Second Embodiment

A semiconductor memory device according to the second embodiment of the present invention will be described next. The same reference numbers as in the first embodiment denote the same parts in the second embodiment, and a description thereof will be omitted.

FIG. 2 is a block diagram showing the arrangement of a semiconductor memory device according to the second embodiment of the present invention. As shown in FIG. 2, a switch circuit 21 capable of adjusting the number of dummy cells (D,0), (D,1), (D,2), ..., (D,L) connected to a dummy word line is arranged. When the output signal from a dummy row decoder 15 should pass through dummy cells (D,0), (D,1), ... and return to dummy cell (D,0), the switch circuit 21 sets the dummy cell at the return point. The switch circuit 21 is arranged in each of replica circuits 14-1 and 14-2, thereby adjusting the input timings of the output signal from the dummy row decoder 15 to local sense activation circuits 17-1 and 17-2. Local sense activation circuits 17-1 and 17-2 output sense start signals in accordance with the received output signal, thereby adjusting the sense start timing of local sense amplifiers 12-0 to 12-M.

When the switch circuit capable of adjusting the number of dummy cells connected to the dummy word line is provided in each cell array, the sense timings of the sense amplifiers can be adjusted individually in each cell array. This prevents errors caused by the timing.

According to the second embodiment, it is possible to provide a semiconductor memory device capable of setting, for each cell array, the activation timings of sense amplifiers included in the cell array. It is also possible to increase the memory capacity without changing the activation timings of the sense amplifiers.

As described above, according to the embodiments of the present invention, a replica circuit for sense timing is arranged for each of the divided cell arrays. When the memory capacity is increased for each cell array, a generator can easily be arranged without newly changing the sense timing. In addition, since a replica circuit for sense timing is arranged locally, i.e., for each cell array, the device is resistant to a variation in threshold voltage Vth, and the yield can be improved.

According to the embodiments of the present invention, it is possible to provide a semiconductor memory device capable of setting, for each cell array, the activation timings of sense amplifiers included in the cell array.

Each of the above embodiments can independently be practiced. However, they may appropriately be combined. The above-described embodiments incorporate inventions of various stages, and inventions of various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a first cell array which has a plurality of memory cells arrayed in row and column directions;
    a word line which is connected to the plurality of memory cells arrayed in the row direction;
    a first bit line which is connected to the plurality of memory cells arrayed in the column direction in the first cell array;
    a first sense amplifier which is connected to the first bit line;
    a first dummy cell array which has a plurality of dummy cells arrayed in row and column directions;
    a dummy word line which is connected to the plurality of dummy cells arrayed in the row direction;
    a first dummy bit line which is connected to the plurality of dummy cells arrayed in the column direction in the first dummy cell array and receives an output from the dummy word line;
    a first sense amplifier activation circuit which activates the first sense amplifier in accordance with a first control signal output from the first dummy bit line;

a second cell array which has a plurality of memory cells arrayed in the row and column directions, the plurality of memory cells arrayed in the row directions being connected to the word line;

a second bit line which is connected to the plurality of memory cells arrayed in the column direction in the second cell array;

a second sense amplifier which is connected to the second bit line;

a second dummy cell array which has a plurality of dummy cells arrayed in row and column directions, the plurality of dummy cells arrayed in the row directions being connected to the dummy word line, the plurality of dummy cells arrayed in the column directions being located between the first cell array and the second cell array, and the plurality of dummy cells arrayed in the column directions being connected to the word line;

a second dummy bit line which is connected to the plurality of dummy cells arrayed in the column direction in the second dummy cell array and receives the output from the dummy word line; and a second sense amplifier activation circuit which activates the second sense amplifier in accordance with a second control signal output from the second dummy bit line.

2. The device according to claim 1, wherein the first sense amplifier activation circuit activates the first sense amplifier of the first cell array by the first control signal output from the first dummy bit line, and the second sense amplifier activation circuit activates the second sense amplifier of the second cell array by the second control signal output from the second dummy bit line.

3. The device according to claim 1, wherein the first sense amplifier activation circuit and the second sense amplifier activation circuit independently activate the first sense amplifier and the second sense amplifier by the first control signal and the second control signal.

4. The device according to claim 1, further comprising a switch circuit which changes the number of dummy cells connected to the dummy word line.

5. The device according to claim 1, further comprising:

a first switch circuit which changes the number of dummy cells connected to the dummy word line in the first cell array; and a second switch circuit which changes the number of dummy cells connected to the dummy word line in the second cell array.

6. The device according to claim 1, which further comprises a row decoder which drives the word line, and in which the first dummy bit line is arranged between the row decoder and the first cell array, and the second dummy bit line is arranged between the first cell array and the second cell array.

7. The device according to claim 1, wherein the first sense amplifier and the second sense amplifier sense the memory cell connected to the first bit line and the memory cell connected to the second bit line, respectively, and read out data stored in the memory cells.

8. The device according to claim 1, wherein the number of dummy cells connected to the first dummy bit line is equal to the number of memory cells connected to the first bit line, and the number of dummy cells connected to the second dummy bit line is equal to the number of memory cells connected to the second bit line.

9. The device according to claim 1, wherein the first dummy bit line is connected to the first sense amplifier activation circuit through an inverter, and the second dummy bit line is connected to the second sense amplifier activation circuit through an inverter.

10. The device according to claim 1, which further comprises a dummy row decoder which is connected to the dummy word line, and in which an output signal from the dummy row decoder is transmitted through the dummy cells by the dummy word line then through the dummy cells by one of the first dummy bit line and the second dummy bit line, and input to one of the first sense amplifier activation circuit and the second sense amplifier activation circuit.

11. The device according to claim 1, wherein the semiconductor memory device includes an SRAM.

* * * * *